United States Patent
Park et al.

(10) Patent No.: US 9,541,807 B2
(45) Date of Patent: Jan. 10, 2017

(54) FLEXIBLE DISPLAY DEVICE

(71) Applicant: LG DISPLAY CO., LTD., Seoul (KR)

(72) Inventors: NamKil Park, Gyeonggi-do (KR); SoonKwang Hong, Daegu (KR)

(73) Assignee: LG Display Co., Ltd., Seoul (KR)

( * ) Notice: Subject to any disclaimer, the term of this patent is extended or adjusted under 35 U.S.C. 154(b) by 60 days.

(21) Appl. No.: 14/077,456

(22) Filed: Nov. 12, 2013

(65) Prior Publication Data

US 2014/0132487 A1 May 15, 2014

(30) Foreign Application Priority Data

Nov. 14, 2012 (KR) ........................ 10-2012-0129088

(51) Int. Cl.
*G02F 1/1333* (2006.01)
*G02F 1/1345* (2006.01)
*H01L 27/32* (2006.01)

(52) U.S. Cl.
CPC ....... *G02F 1/13454* (2013.01); *H01L 27/3223* (2013.01); *G02F 1/133305* (2013.01); *G02F 2001/133388* (2013.01); *H01L 2251/5338* (2013.01)

(58) Field of Classification Search
CPC ............ G02F 1/13454; G02F 1/133305; H01L 27/3223; G09G 3/00; G09G 2380/02; B65D 2581/3466; H05B 6/6494; H04N 13/02
USPC .......................................................... 345/55
See application file for complete search history.

(56) References Cited

U.S. PATENT DOCUMENTS

| | | | |
|---|---|---|---|
| 6,424,092 B1* | 7/2002 | Odake et al. ............... | 315/169.3 |
| 2010/0085299 A1* | 4/2010 | Yoon et al. ................... | 345/107 |
| 2010/0213819 A1* | 8/2010 | Cok ..................... | H01L 27/3255 313/498 |
| 2010/0327316 A1* | 12/2010 | Pourtois ............ | H01L 21/02387 257/190 |
| 2011/0007042 A1* | 1/2011 | Miyaguchi ..................... | 345/204 |
| 2011/0025968 A1* | 2/2011 | Yu ..................... | G02F 1/136286 349/139 |
| 2011/0122559 A1* | 5/2011 | Lee ........................ | B32B 17/061 361/679.01 |

(Continued)

FOREIGN PATENT DOCUMENTS

| CN | 1901206 A | 1/2007 |
|---|---|---|
| CN | 102156360 A | 8/2011 |

OTHER PUBLICATIONS

Chinese Office Action issued in Chinese Patent Application No. 201310556805.X on Dec. 3, 2015.

*Primary Examiner* — Nicholas Lee
*Assistant Examiner* — Richard Hong
(74) *Attorney, Agent, or Firm* — Morgan, Lewis & Bockius LLP

(57) ABSTRACT

Disclosed is a flexible display device capable of preventing contact inferiority with a driving device when the driving device is mounted onto the flexible display device bent in one direction. The flexible display device includes: a substrate having a display region and a dummy region, and forming a curved surface by being bent in one direction; and one or more driving devices mounted onto the dummy region of the substrate, wherein the driving device is mounted such that short sides thereof are disposed along the curved surface of the substrate, and long sides thereof are disposed on a planar surface of the substrate.

11 Claims, 3 Drawing Sheets

(56) References Cited

U.S. PATENT DOCUMENTS

2011/0242442 A1\* 10/2011 Lee et al. ..................... 349/15
2012/0281369 A1\* 11/2012 Chen et al. ................ 361/748

\* cited by examiner

FLEXIBLE DISPLAY DEVICE

CROSS-REFERENCE TO RELATED APPLICATION

Pursuant to 35 U.S.C. §119(a), this application claims the benefit of earlier filing date and right of priority to Korean Application No. 10-2012-0129088, filed on Nov. 14, 2012, the contents of which is incorporated by reference herein in its entirety.

BACKGROUND OF THE DISCLOSURE

1. Field of the Disclosure

The present disclosure relates to a display device, and particularly, to a display device capable of preventing contact inferiority between a driving device and a flexible substrate when the driving device is mounted onto the flexible substrate, the contact inferiority occurring due to a bent state of the flexible substrate.

2. Background of the Disclosure

Recently, various types of flat display devices, capable of overcoming disadvantages of a cathode ray tube, e.g., a large weight and a massive volume, are being developed. Such flat display devices may include liquid crystal display devices, field emission display devices, plasma display panels, organic electroluminescent display devices, etc.

Further, many efforts are ongoing to implement the flat display device as a flexible display device, for portability, implementation of various shapes, prevention of damage, etc. For instance, a liquid crystal display (LCD) device and an organic electroluminescent display device are implemented as flexible substrates formed of a flexible material such as plastic, so that a flexible LCD device and a flexible organic electroluminescent display device can be fabricated.

However, the flexible display device may have the following problems.

Generally, an LCD device and an organic electroluminescent display device display images under the following configuration. A plurality of gate lines and a plurality of data lines are formed on a substrate so as to cross each other, thereby defining pixel regions for displaying images. A thin film transistor (TFT) is formed at each intersection between the gate lines and the data lines. The TFT is turned-on as scan signals are applied to the gate lines, and thus data signals of the data lines are applied to the pixel regions.

A driving circuit includes a gate driving device configured to drive a plurality of gate lines, a data driving device configured to drive a plurality of data lines, a timing controller configured to supply a control signal, a data signal, etc. for controlling the gate driving device and the data driving device, and so on.

Generally, a gate driving device and a data driving device are mounted to a Taped Carrier Package (TCP) attached to a substrate and a printed circuit board (PCB). And a timing controller is mounted to a PCB, and applies a signal to a display panel.

In recent years, a Chip On Glass (COG) technique has been presented in order to reduce the fabrication costs by reducing a volume of a display device and simplifying the fabrication processes. Such COG technique serves to directly attach a gate driving device and/or a data driving device onto a display panel, not to mount the gate driving device and/or the data driving device to a TCP. As such COG technique requires no additional TCP, the fabrication costs can be reduced. Further, as a process to attach a TCP onto a substrate and a PCB is omitted, the fabrication processes can be simplified.

However, in a case where a driving device is directly mounted to a flexible display panel, the following problems may occur.

FIGS. 1A and 1B are conceptual views illustrating that a driving device has been mounted to a flexible display panel.

As shown in FIG. 1A, a display panel 1 includes a display region (P) for displaying images, and a dummy region (D) outside the display region (P). Although not shown, pixel regions defined by a plurality of gate lines and a plurality of data lines are formed in the display region (P). A thin film transistor is formed at each pixel region. A plurality of gate pads and a plurality of data pads, connected to the gate lines and the data lines and configured to apply external signals to the pixel regions through the gate lines and the data lines, are formed at the dummy region (D).

The display panel 1, a Gate In Panel (GIP) type display panel, applies scan signals to the gate lines in the display region (P), through gate pads. The gate pads are formed at two gate-internal circuits 10 disposed at right and left sides of the dummy region (D). The GIP type display panel is used to directly form a gate driving circuit on a substrate, not to mount a gate driving circuit onto a substrate or a TCP. This is advantageous in that the material cost, the number of processes, processing time, etc. can be reduced. A data driving device 20 is attached to an upper portion of the dummy region (D).

As shown in FIG. 1B, the display panel 1 is a flexible display panel which can be bent. The flexible display panel means that the display panel 1 can be bent in various directions. However, more specifically, the flexible display panel means a display panel installed at an electronic device in a bent state in a specific direction. That is, a general display device can not be applied to various types of electronic devices, because it can not be bent. However, the flexible display device can be applied to various types of electronic devices, e.g., an electronic device of which screen is formed to have a curvature, because it can be bent in a specific direction.

Referring to FIG. 1B, the display panel 1 is bent in a horizontal direction (i.e., an extension direction of the gate line), and the data driving device 20 is attached onto the display panel 1. In this case, the display panel 1 is bent with a curvature in a horizontal direction, and the data driving device 20 is attached onto the display panel 1 so that long edges thereof can be arranged in a horizontal direction. Under such configuration, the data driving device 20 may not come in contact with the display panel 1 at edge regions thereof, due to a stress by the curvature. This may cause inferiority of a picture quality, such as dark lines occurring in a vertical direction at parts on a screen corresponding to the edge regions.

SUMMARY OF THE DISCLOSURE

Therefore, an aspect of the detailed description is to provide a flexible display device capable of preventing occurrence of contact inferiority between a driving device and a substrate, by mounting the driving device on a planar surface of the substrate not on a curved surface of the substrate, the contact inferiority resulting from a stress due to a curvature of the substrate.

Another aspect of the detailed description is to provide a flexible organic electroluminescent display device capable of preventing occurrence of contact inferiority between a driving device and a substrate, the contact inferiority resulting from a stress due to a curvature of the substrate.

To achieve these and other advantages and in accordance with the purpose of this specification, as embodied and broadly described herein, there is provided a flexible display device, comprising: a substrate having a display region and a dummy region, and forming a curved surface by being bent in one direction; and at least one driving device mounted onto the dummy region of the substrate, wherein the driving device is mounted such that short sides thereof are disposed along the curved surface, and long sides thereof are disposed on a planar surface of the substrate.

To achieve these and other advantages and in accordance with the purpose of this specification, as embodied and broadly described herein, there is also provided an organic electroluminescent display device, comprising: a flexible substrate having a display region, a first pad portion and a second pad portion, and bent in one direction such that the first pad portion is formed as a curved surface and the second pad portion is formed as a planar surface; a driving thin film transistor formed on each of a plurality of pixel regions in the display region of the substrate; a thin film transistor for a driving device, formed at the first pad portion; a pixel electrode formed at each pixel region in the display region; an organic light-emitting portion formed at the pixel region in the display region, and configured to emit light; a common electrode formed on the organic light-emitting portion and a bank layer, and configured to apply a signal to an organic light-emitting layer; a first passivation layer, an organic insulating layer and a second passivation layer formed in a dummy region and the display region; and a driving device mounted onto the second passivation layer in the second pad portion.

The present invention can have the following advantages.

The driving device is mounted onto a planar surface of the flexible display device bent to have a prescribed curvature, not on a curved surface. Under such configuration, a stress due to the curvature of the substrate can be prevented from being applied to the driving device. As a result, contact inferiority between the driving device and the substrate due to the stress can be prevented.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a flexible display device according to the present invention will be explained in more detail with reference to the attached drawings.

The present invention provides a flexible display device capable of preventing contact inferiority from occurring on a region where a driving device is mounted to a substrate, the contact inferiority resulting from a bent state of the substrate. In the present invention, the flexible display device is implemented as a flexible organic electroluminescent display device. However, the present invention is not limited to a specific display device, but may be also applicable to all types of flat display devices which can be bent, such as a liquid crystal display (LCD) device, an electrophoresis display device, etc.

In the present invention, a driving device is not mounted to a curved surface of a flexible display device, but is mounted to a planar surface of the flexible display device. Accordingly, a stress due to a curvature of the flexible display device is not applied to a mounting region of the driving device.

Figure 1A:
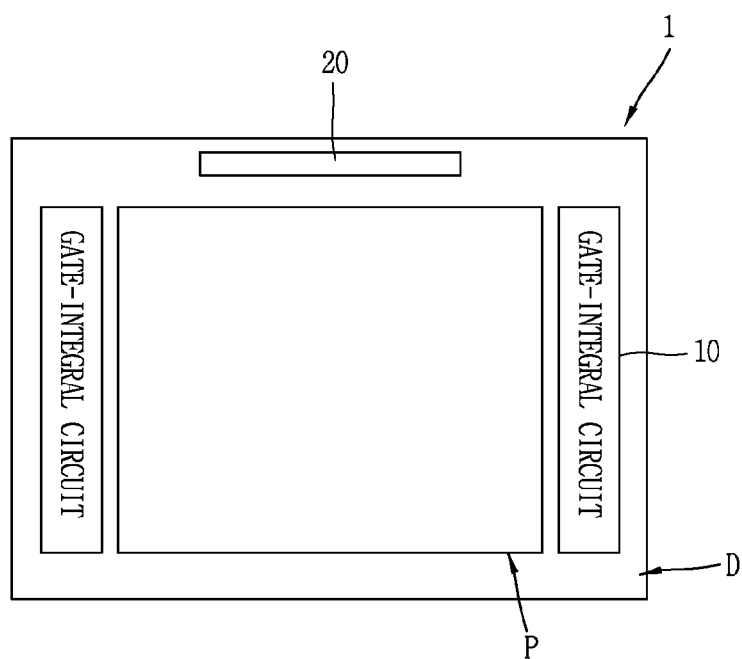
FIG. 1A is a planar view schematically illustrating a flexible display device in accordance with the conventional art.
Figure 1B:
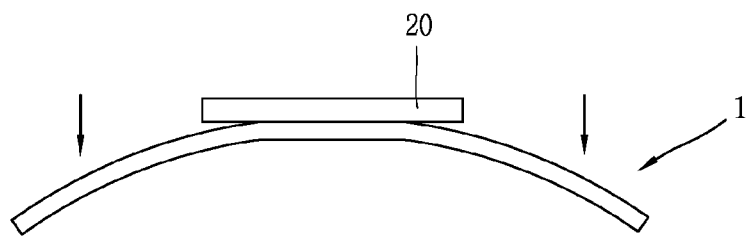
FIG. 1B is a view illustrating a state where a driving device has been mounted to a flexible display device in accordance with the conventional art.
Figure 2A:
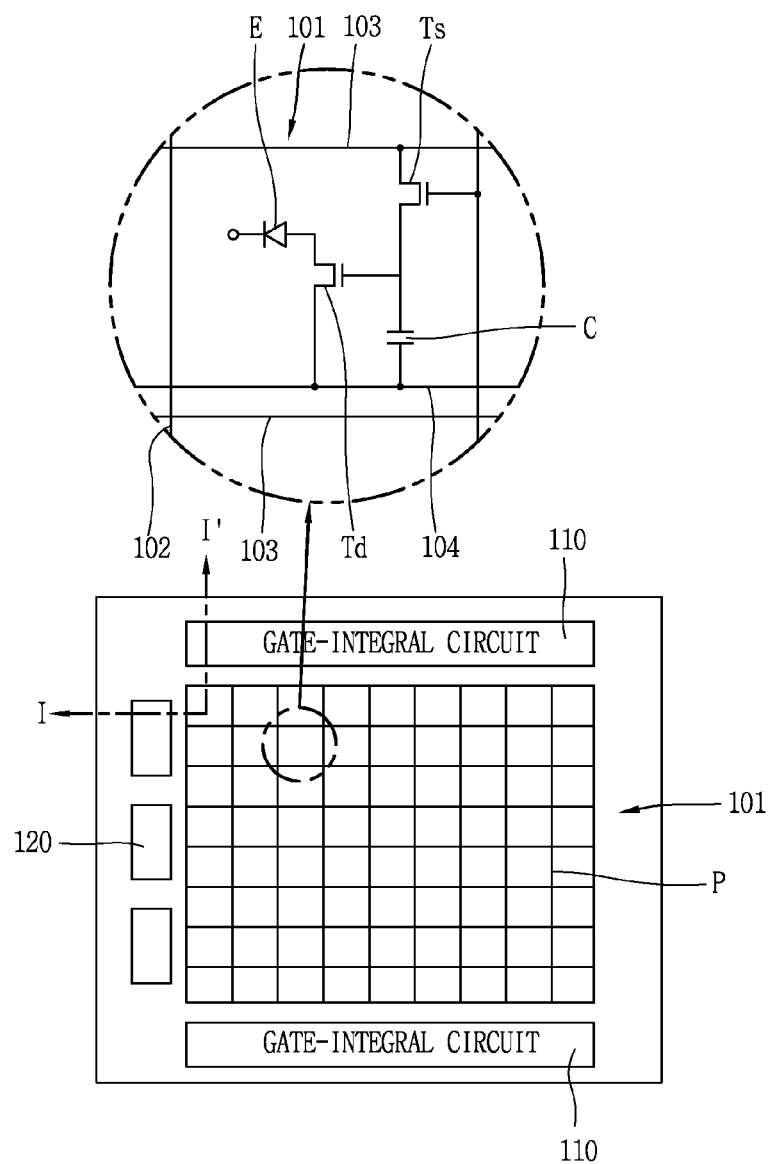
FIG. 2A is a planar view schematically illustrating a flexible display device according to the present invention.
Figure 2B:
FIG. 2B is a view illustrating a state where a driving device has been mounted to a flexible display device according to the present invention.

FIG. 2 is a view schematically illustrating a flexible display device according to the present invention, in which FIG. 2A is a planar view and FIG. 2B is a side sectional view.

As shown in FIG. 2A, an organic electroluminescent display panel 101 comprises a display region (P) where a plurality of pixel regions are defined by a plurality of gate lines 102 and data lines 103 crossing each other, and a dummy region (D) disposed at an outer side of the display region (P) and having gate pads or data pads, etc.

The display region (P) is a region where images are substantially implemented and a plurality of pixel regions are formed. The pixel regions are defined by a plurality of gate lines 102 arranged in a vertical direction, and a plurality of data lines 103 arranged in a horizontal direction. A power line (P) is arranged in each pixel region, in parallel to the data line 103.

A switching thin film transistor (Ts), a driving thin film transistor (Td), a capacitor (C) and an organic light-emitting device (E) are provided in each pixel. A gate electrode of the switching thin film transistor (Ts) is connected to the gate line 102, a source electrode is connected to the data line 103, and a drain electrode is connected to a gate electrode of the driving thin film transistor (Td). A source electrode of the driving thin film transistor (Td) is connected to the power line (P), and a drain electrode of the driving thin film transistor (Td) is connected to the organic light-emitting device (E).

Although not shown, a plurality of gate pads and data pads connected to the gate lines 102 and the data lines 103 are formed at the dummy region (D). Gate-internal circuits 110 are formed at an upper portion of the dummy region (e.g., a gate pad portion of the dummy region).

The gate-internal circuits 110 include a plurality of thin film transistors and various types of lines, and are formed by the same processes as the thin film transistor and the lines of the pixel regions in the display region (P). A data driving device 120 is mounted to one side or two sides of the dummy region (D).

In drawings, the gate-internal circuits 110 are formed at an upper gate pad portion and a lower gate pad portion. However, the gate-internal circuits 110 may be formed only at the upper gate pad portion, or the lower gate pad portion.

The data driving device 120, an integrated circuit (IC) fabricated in the form of a chip, is attached to the organic electroluminescent display panel 101 by an adhesive such as resin. Although not shown, an input-output terminal is formed at the data driving device 120. The input-output terminal is connected to lines formed in the dummy region (D) by a bonding member such as a bump, thus to be electrically connected to a data pad.

In the organic electroluminescent display device, once a scan signal is input from the gate-internal circuit 110 through the gate line 102, the signal is applied to the gate electrode of the switching thin film transistor (Ts). As a result, the switching thin film transistor (Ts) is driven. As the switching thin film transistor (Ts) is driven, a data signal input from the data driving device 120 through the data line 103 is input to the gate electrode of the driving thin film transistor (Td) through the source electrode and the drain electrode. As a result, the driving thin film transistor (Td) is driven.

A current flows on the power line (P). As the driving thin film transistor (Td) is driven, the current on the power line (P) is applied to the organic light-emitting device (E) through the source electrode and the drain electrode. The current output through the driving thin film transistor (Td) has a size variable according to a voltage between the gate electrode and the drain electrode.

The organic light-emitting device (E) emits light as a current is input thereto through the driving thin film transistor (Td), thereby displaying images. An intensity of light to be emitted becomes different according to an intensity of an applied current. Therefore, the intensity of light to be emitted can be controlled by controlling the intensity of an applied current.

As shown in FIG. 2B, the organic electroluminescent display panel 101, a flexible display panel 101, maintains a bent state in a prescribed direction. That is, the organic electroluminescent display panel 101 is bent in a horizontal direction by a force applied in a vertical direction, thereby maintaining a curved line having a curvature in a horizontal direction. The curvature of the organic electroluminescent display panel 101 becomes different according to a type of an electronic device to which the organic electroluminescent display panel 101 is applied, etc. However, the curvature of the organic electroluminescent display panel 101 may be large enough for the organic electroluminescent display panel 101 to be bent completely.

The data driving device 120 is mounted to two side surfaces of the dummy region (D) of the organic electroluminescent display panel 101. In the conventional organic electroluminescent display panel 101, the data driving device 120 is mounted to an upper portion of the dummy region (D). However, in the present invention, the data driving device 120 is mounted to a side portion of the dummy region (D) due to the following reasons.

As shown in FIG. 2B, in a case where the organic electroluminescent display panel 101 has a curvature in a horizontal direction, if long sides of the data driving device 120 are arranged in a horizontal direction along a curved surface, a stress is generated at a region where the data driving device 120 is attached to the organic electroluminescent display panel 101, due to the curvature. As a result, two sides of the long edge of the data driving device 120 are separated from the organic electroluminescent display panel 101, and thus contact inferiority occurs at the two sides. However, in a case where the data driving device 120 is attached to the side surface of the organic electroluminescent display panel 101 in a vertical direction, the long sides of the data driving device 120 are arranged on a planar surface of the organic electroluminescent display panel 101, while the short sides of the data driving device 120 are arranged along a curved surface of the organic electroluminescent display panel 101. However, since the short sides of the data driving device 120 are much shorter than the long sides thereof, a stress due to the curved surface is not applied to a region where the data driving device 120 is attached to the organic electroluminescent display panel 101. Therefore, a stress is not generated at the region where the data driving device 120 is attached to the organic electroluminescent display panel 101.

Under such configuration, inferiority of electrical contact between the data driving device 120 and the organic electroluminescent display panel 101 due to lowering of an adhesive force therebetween can be prevented.

In the present invention, the data driving device 120 may be mounted to various positions to the organic electroluminescent display panel 101, according to a bent direction of the organic electroluminescent display panel 101. That is, the data driving device 120 is mounted to the organic electroluminescent display panel 101 in a direction vertical to a bent direction of the organic electroluminescent display panel 101. Therefore, in the present invention, the data driving device 120 can be mounted, in various manners, to the organic electroluminescent display panel 101 installed at various types of electronic devices.

Hereinafter, an embodiment of the organic electroluminescent display device according to the present invention will be explained in more details.

Figure 3:
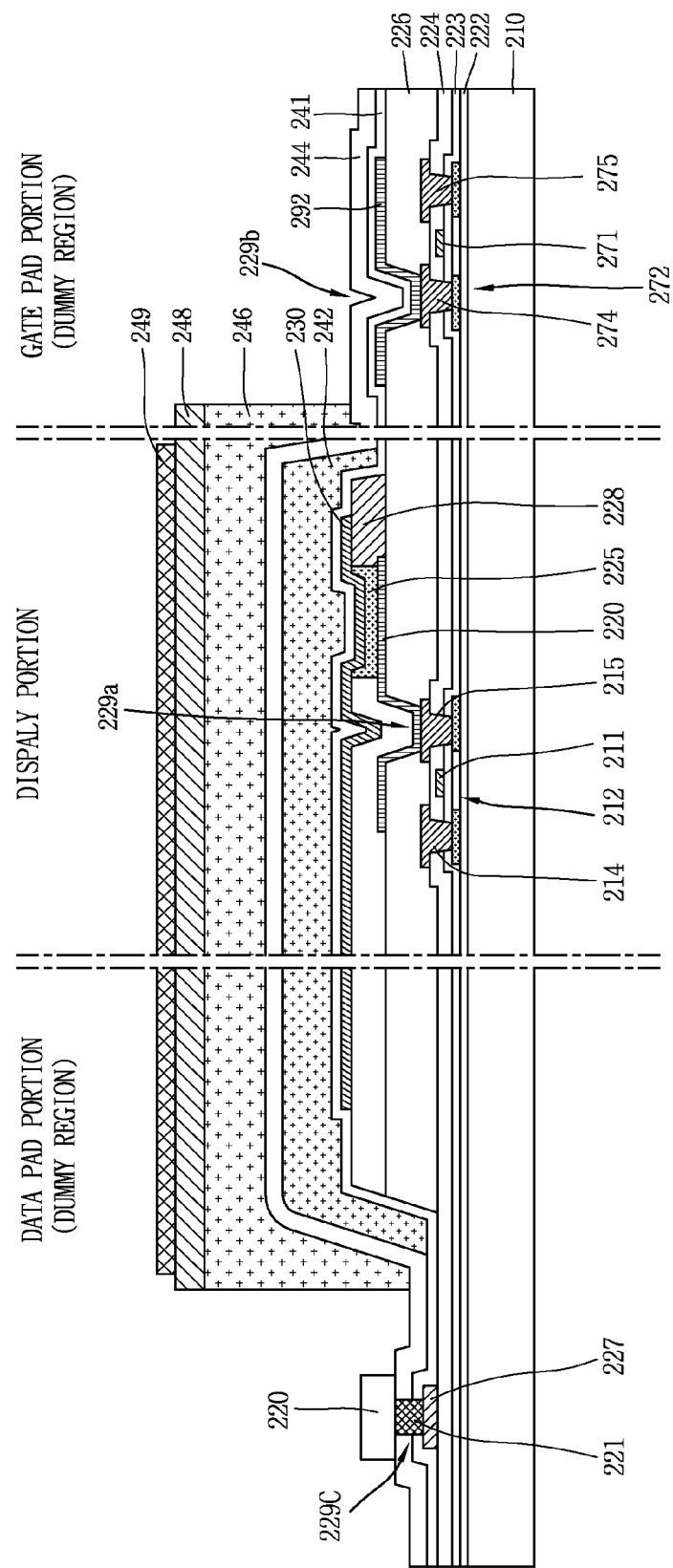
FIG. 3 is a sectional view illustrating a structure of an organic electroluminescent display device according to the present invention.

FIG. 3 is a sectional view taken along line I-I' of FIG. 2A.

As shown in FIG. 3, the organic electroluminescent display device according to the present invention comprises a display region where images are substantially implemented, a gate pad portion in the display region where a gate-internal circuit, etc. are formed, and a data pad portion in the display region where a data driving device is mounted.

A driving thin film transistor is formed at a display region of a substrate 210 formed of a flexible material, e.g., a plastic material such as polyimide. And a thin film transistor for the gate-internal circuit 110 is formed at the gate pad portion. As the substrate 210 is bent in a horizontal direction, the gate pad portion is formed as a curved surface having a prescribed curvature.

Although not shown, the driving thin film transistor comprises a buffer layer 222 formed on R, G and B pixel regions and formed on the substrate 210, a first semiconductor layer 212 formed on the buffer layer 222 where the R, G and B pixel regions have been formed, a first insulating layer 223 formed on an entire region of the substrate 210 where the first semiconductor layer 212 has been formed, a first gate electrode 211 formed on the first insulating layer 223, a second insulating layer 224 formed on an entire region of the substrate 210 so as to cover the first gate electrode 211, and a first source electrode 214 and a first drain electrode 215 contacting the first semiconductor layer 212 through contact holes of the first insulating layer 223 and the second insulating layer 224, respectively.

The thin film transistor for a driving device, which is formed at the gate pad portion, comprises a second semiconductor layer 272 formed at R, G and B pixel regions on the buffer layer 222, a first insulating layer 223 formed on an entire region of the substrate 210 where the second semiconductor layer 272 has been formed, a second gate electrode 271 formed on the first insulating layer 223, a second insulating layer 224 formed on an entire region of the substrate 210 so as to cover the second gate electrode 271, and a second source electrode 274 and a second drain electrode 275 contacting the second semiconductor layer 272 through the contact holes of the first insulating layer 223 and the second insulating layer 224, respectively.

The buffer layer 222 may be formed of a single layer or multiple layers. The first semiconductor layer 212 may be formed of a transparent oxide semiconductor such as crystalline silicone or IGZO (Indium Gallium Zinc Oxide). The first semiconductor layer 212 is composed of a channel layer formed at a central region thereof, and a doping layer formed at two sides of the channel layer. Under such configuration, the first source electrode 214 and the first drain electrode 215 come in contact with the doping layer. The second semiconductor layer 272 is formed of multi-crystalline silicone.

The first gate electrode 211 and the second gate electrode 271 may be formed of a metallic material such as Cr, Mo, Ta, Cu, Ti, Al or Al alloy. The first insulating layer 223 and the second insulating layer 224 may be formed of a single layer formed of an inorganic insulating material such as $SiO_2$ or SiNx, or double layers formed of $SiO_2$ and SiNx. The first source electrode 214, the first drain electrode 215, the second source electrode 274 and the second drain electrode 275 may be formed of Cr, Mo, Ta, Cu, Ti, Al or Al alloy.

A third insulating layer 226 is formed on the substrate 210 where the driving thin film transistor and the thin film transistor for a driving device have been formed. The third insulating layer 226 may be formed of an inorganic insulating material such as $SiO_2$.

Although not shown, an overcoat layer for planarizing the substrate 210 may be formed on the third insulating layer 226.

Although not shown, a gate pad, configured to apply a scan signal to the first gate electrode 211 of the driving thin film transistor, is formed on the first insulating layer 223 in the gate pad portion. The gate pad serves to apply an external signal to the display region, which may be formed by the same processes as the first gate electrode 211 and the second gate electrode 271. Although not shown, a data pad is formed at the data pad portion.

A pixel electrode 220 is formed on the third insulating layer 226 in the display region. The pixel electrode 220 is formed of a metallic material such as Ca, Ba, Mg, Al and Ag. As the pixel electrode 220 is connected to the first drain electrode 215 of the driving thin film transistor, an image signal is applied to the pixel electrode 220 from outside. A first signal line 292 is formed at the third insulating layer 226 of the gate pad portion. The first signal line 292 may be formed of a different metallic material from the pixel electrode 220, through different processes from the pixel electrode 220. However, for reduction of the number of processes and the fabrication costs, the first signal line 292 is preferably formed of the same material and through the same processes as the pixel electrode 220.

A first contact hole 229a is formed at the third insulating layer 226, above the first drain electrode 215 of each thin film transistor formed at each pixel region in the display region. Under such configuration, the pixel electrode 220 formed on the third insulating layer 226 is electrically connected to the first drain electrode 215 of the driving thin film transistor, through the first contact hole 229a. The first signal line 292 is formed on the third insulating layer 226 of the gate pad portion. The first signal line 292 is electrically connected to the second drain electrode 275 for a driving device, through a second contact hole 229b of the third insulating layer 226. Under such configuration, the first signal line 292 applies a signal to the pixel region.

A bank layer 228 is formed on the third insulating layer 226, between the pixel regions in the display region. The bank layer 228, a sort of barrier, is configured to partition pixel regions from each other, thereby preventing lights of specific colors output from the neighboring pixel regions, from being mixed to each other for output. The bank layer 228 fills part of the first contact hole 229a, thereby reducing a stepped portion. This may prevent an organic light-emitting portion from having inferiority due to an excessive stepped portion. The back layer 228 may be extended up to part of the gate pad portion.

An organic light-emitting portion 225 is formed on the pixel electrode 220 between the bank layers 228 in the display region. The organic light-emitting portion 225 includes an R-organic light-emitting layer which emits red light, a G-organic light-emitting layer which emits green light, and a B-organic light-emitting layer which emits blue light. Although not shown, an electron injection layer for injecting electrons to the organic light-emitting layer, a hole injection layer for injecting holes to the organic light-emitting layer, an electron transport layer for transporting injected electrons to the organic light-emitting layer, and a hole transport layer for transporting injected holes to the organic light-emitting layer, as well as an organic light-emitting layer, may be formed at the organic light-emitting portion 225.

The organic light-emitting layer may be implemented as a white organic light-emitting layer which emits white light. In this case, R, G and B color filter layers are formed below the white organic light-emitting layer (e.g., at R, G and B sub-pixel regions on the second insulating layer 224), thereby converting white light emitted from the white organic light-emitting layer into red light, green light and blue light. The white organic light-emitting layer may be formed as a plurality of organic materials which emit lights of R, G and B individually are mixed with each other. Alternatively, the white organic light-emitting layer may be formed as a plurality of light-emitting layers which emit lights of R, G and B individually are laminated with each other.

A common electrode 230 is formed on the organic light-emitting portion 225 in the display region. The common electrode 230 is formed of a transparent metal-oxide material such as ITO (Indium Tin Oxide) or IZO (Indium Zinc Oixde).

The common electrode 230 is an anode of the organic light-emitting portion 225, and the pixel electrode 220 is a cathode of the organic light-emitting portion 225. Once a voltage is applied to the common electrode 230 and the pixel electrode 220, electrons from the pixel electrode 220 are injected to the organic light-emitting portion 225. And holes from the common electrode 230 are injected to the organic light-emitting portion 225. As a result, excitons are generated from the organic light-emitting layer. As the excitons decay, light corresponding to an energy difference between a lowest unoccupied molecular orbital (LUMO) and a highest occupied molecular orbital (HOMO) of the organic light-emitting layer is generated. Then, the generated light is emitted to outside (toward an upper side of the common electrode 230).

A first passivation layer 241 is formed on an entire region of the substrate 210 in the dummy region (i.e., the gate pad portion and the data pad portion) and the display region. The first passivation layer 241 is formed of an inorganic material such as $SiO_2$ or SiNx.

An organic layer 243, formed of an organic material such as polymer, is disposed on the first passivation layer 241 in the display region and a region of the gate pad portion. A second passivation layer 244 formed of an inorganic material such as $SiO_2$ or SiNx is formed on an entire region of the substrate 210.

An adhesive is deposited on the second passivation layer 244 to thus form an adhesive layer 246. A passivation film 248 is disposed on the adhesive layer 246, to thus be attached to the second passivation layer 244 by the adhesive layer 246.

Any material having excellent adhesion property, heat-proof property and waterproof property may be used as the adhesive. However, in the present invention, a thermal hardening resin such as an epoxy-based compound, an acrylate-based compound or an acryl-based rubber is used as the adhesive. In this case, the adhesive layer 246 is deposited in a thickness of about 5-100 μm, and is hardened at a temperature of about 80-170° C. As the adhesive, a photopolymer resin may be used. In this case, light such as ultraviolet rays is irradiated onto the adhesive layer 246 to thus harden the adhesive layer 246.

The adhesive layer 246 serves to attach the substrate 210 and the passivation film 248 to each other. Further, the adhesive layer 246 serves as an encapsulant for preventing moisture from being introduced into the organic electroluminescent display device. Therefore, in the detailed description of the present invention, reference numeral 146 is referred to as an adhesive for convenience. The adhesive layer may be also referred to as an 'encapsulation material'.

The passivation film 248, an encapsulation cap for encapsulating the adhesive layer 246, may be implemented as a polystyrene (PS) film, a polyethylene (PE) film, a polyethylene naphthalate (PEN) film, or a polyimide (PI) film.

A polarizing plate 249 may be attached onto the passivation film 248. The polarizing plate 249 transmits light emitted from the organic electroluminescent display device, and prevents light incident from outside from being reflected, thereby enhancing a picture quality. A second signal line 227 is formed on the third insulating layer 226 of the data pad portion. The first passivation layer 241 and the second passivation layer 244 are formed on the second signal line 227. A data driving device 220 implemented as an integrated circuit (IC) is mounted onto the second passivation layer 244. Although not shown, the data driving device 220 may be attached onto the second passivation layer 244 by an adhesive such as resin.

A third contact hole 229c is formed at the first passivation layer 241 and the second passivation layer 244. The second signal line 227 is exposed to outside through the third contact hole 229c, and is electrically connected to a terminal (not shown) of the data driving device 220 by a connection member 221 such as a bump.

As aforementioned, in the present invention, the driving device is mounted onto a planar surface of the flexible display panel, not on a curved surface. Under such configuration, the occurrence of a stress due to the curved surface can be prevented. As a result, contact inferiority between the driving device and the flexible display panel can be prevented.

In the aforementioned detailed description, the flexible display device is implemented as a flexible organic electroluminescent display device. However, the present invention is not limited to this. That is, the flexible display device may be applicable to all types of flexible display devices such as a flexible electroluminescent display device, a flexible liquid crystal display (LCD) device and a flexible electrophoresis display device.

In the aforementioned detailed description, an organic electroluminescent display device having a specific structure has been disclosed. However, the present invention is not limited to such organic electroluminescent display device, but may be applicable to various types of organic electroluminescent display devices. Likewise, the flexible display device according to the present invention may be applicable to LCD devices in various modes, or electrophoresis display devices having various structures, etc.

In the aforementioned detailed description, the gate driving device is formed on the substrate, and only the data driving device is mounted onto the substrate in the form of an integrated circuit. However, only the gate driving device may be mounted onto the substrate in the form of an integrated circuit. Alternatively, both of the gate driving device and the data driving device may be mounted onto the flexible substrate in the form of an integrated circuit.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:
1. A flexible display device, comprising:
a flexible substrate having a display region and a dummy region, and forming a curved surface by being bent in one direction;
a buffer layer on the flexible substrate in both the display region and the dummy region;
a signal line on the buffer layer and extending from the dummy region to the display region;
a passivation layer on the buffer layer in both the display region and the dummy region;
at least one driving device mounted on the passivation layer in the dummy region of the flexible substrate,
wherein the driving device is mounted on the passiviation layer such that short sides of the driving device are disposed along the curved surface of the flexible sub- strate, and long sides of the driving device are disposed on a planar surface of the flexible substrate, and wherein a contact hole is formed in the passivation layer to expose the signal line, and the driving device is connected to the signal line via the contact hole.

2. The flexible display device of claim 1, wherein the driving device includes at least one of a gate driving device and a data driving device.

3. The flexible display device of claim 1, further comprising an internal driving circuit mounted in the dummy region along the one direction in which the flexible substrate is bent.

4. The flexible display device of claim 1, wherein the display device is one of an organic electroluminescent display device, a liquid crystal display device, an electrophoresis display device and a plasma display device.

5. The flexible display device of claim 1, further comprising a contact member disposed in the contact hole and connected to the driving device and the signal line.

6. An organic electroluminescent display device, comprising:
    a flexible substrate having a display region, a gate pad portion and a data pad portion, and bent in one direction such that one of the gate pad portion and the data pad portion is formed along a curved surface and the other of the gate pad portion and the data pad portion is formed along a substantially planar surface;
    a driving thin film transistor formed on each of a plurality of pixel regions in the display region of the flexible substrate;
    a thin film transistor for a driving circuit, formed at the one of the gate pad portion and the data pad portion;
    a pixel electrode formed at each pixel region in the display region;
    an organic light-emitting portion formed at the pixel regions in the display region, and configured to emit light;
    a common electrode formed on the organic light-emitting portion and a bank layer, and configured to apply a signal to an organic light-emitting layer;
    a first passivation layer, an organic insulating layer and a second passivation layer formed in the gate pad portion, the data pad portion and the display region; and
    a driving device mounted onto the second passivation layer in the other of the gate pad portion and the data pad portion, wherein the driving device is mounted on the flexible substrate such that short sides of the driving device are disposed along the one direction in which the flexible substrate is bent, and long sides of the driving device are disposed along a direction perpendicular to the one direction, and wherein a contact hole is formed through the first and second passivation layers, and a connection member is disposed in the contact hole and is connected to the driving device.

7. The organic electroluminescent display device of claim 6, wherein the flexible substrate is formed of polyimide.

8. The organic electroluminescent display device of claim 6, further comprising:
    an adhesive layer formed on the second passivation layer; and
    a passivation film adhered to the second passivation layer by the adhesive layer.

9. The organic electroluminescent display device of claim 6, further comprising a first signal line formed at the one of the gate pad portion and the data pad portion, and connected to the thin film transistor for the driving circuit.

10. The organic electroluminescent display device of claim 6, further comprising a second signal line formed at the other of the gate pad portion and the pad portion, and electrically connected to a terminal of the driving device via the connection member.

11. The organic electroluminescent display device of claim 6, further comprising a buffer layer on the flexible substrate in the display region, the gate pad portion and the data pad portion, wherein the driving thin film transistor and the thin film transistor are disposed over the buffer layer.

* * * * *